US009733662B2

(12) United States Patent
Mahooti et al.

(10) Patent No.: US 9,733,662 B2
(45) Date of Patent: Aug. 15, 2017

(54) FAST START UP, ULTRA-LOW POWER BIAS GENERATOR FOR FAST WAKE UP OSCILLATORS

(75) Inventors: Kevin Mahooti, San Jose, CA (US); Sanket Gandhi, San Jose, CA (US)

(73) Assignee: NXP B.V., Eindhoven (NL)

( * ) Notice: Subject to any disclaimer, the term of this patent is extended or adjusted under 35 U.S.C. 154(b) by 685 days.

(21) Appl. No.: 13/192,107

(22) Filed: Jul. 27, 2011

(65) Prior Publication Data

US 2013/0027150 A1    Jan. 31, 2013

(51) Int. Cl.
| H03L 1/00 | (2006.01) |
| G05F 3/24 | (2006.01) |
| G05F 3/26 | (2006.01) |
| G05F 1/10 | (2006.01) |
| H03L 3/00 | (2006.01) |

(52) U.S. Cl.
CPC ............. G05F 3/242 (2013.01); G05F 1/10 (2013.01); G05F 3/26 (2013.01); H03L 3/00 (2013.01)

(58) Field of Classification Search
CPC ... G05F 3/26; G05F 1/10; G05F 3/242; H03L 3/00
USPC ......... 331/186; 327/142, 538; 323/313, 315, 323/321, 901
See application file for complete search history.

(56) References Cited

U.S. PATENT DOCUMENTS

| 5,329,246 A | * | 7/1994 | Mahabadi | 330/267 |
|---|---|---|---|---|
| 5,825,237 A | * | 10/1998 | Ogawa | 327/545 |
| 5,940,322 A | * | 8/1999 | Atsumi | 365/185.18 |
| 5,949,227 A | * | 9/1999 | Bujanos | 323/313 |
| 6,002,617 A | * | 12/1999 | Manning | 365/189.09 |
| 6,057,721 A | | 5/2000 | Nolan et al. | |
| 6,118,348 A | * | 9/2000 | Narahara | 331/116 FE |
| 6,191,646 B1 | | 2/2001 | Shin | |
| 6,242,898 B1 | | 6/2001 | Shimizu et al. | |
| 6,400,207 B1 | | 6/2002 | Ivanov et al. | |
| 6,894,473 B1 | * | 5/2005 | Le et al. | 323/314 |
| 7,602,234 B2 | * | 10/2009 | Wong et al. | 327/538 |
| 7,659,705 B2 | * | 2/2010 | Hung | 323/313 |
| 8,350,611 B1 | * | 1/2013 | Hsu | 327/198 |
| 2012/0212207 A1 | * | 8/2012 | Chen | 323/313 |
| 2012/0229117 A1 | * | 9/2012 | Nikolov et al. | 323/313 |

FOREIGN PATENT DOCUMENTS

| FR | 2 861 861 | 5/2005 |
| GB | 2 336 960 A | 11/1999 |

OTHER PUBLICATIONS

Delbruck, T. et al. "Bias Current Generators with Wide Dynamic Range", IEEE Proceedings of the International Symposium on Circuits and Systems, vol. 1, 4 pgs (May 2004).
Extended European Se arch Report for Patent Appln. No. 12176294.2 (Jun. 12, 2012).
European Office Action issued Jun. 2, 2014 for Appl. No. 12 176 294.2.

* cited by examiner

Primary Examiner — Richard Tan

(57) ABSTRACT

Various embodiments relate to a bias generator including: a bias generator circuit; a master startup circuit that applies current to a first node in the bias generator circuit; a second startup circuit that applies current to additional nodes in the bias generator circuit; and a power switch that receives a power from a power supply and that provides power to the bias generator circuit, the master startup circuit, and the second startup circuit.

18 Claims, 3 Drawing Sheets

US 9,733,662 B2

FAST START UP, ULTRA-LOW POWER BIAS GENERATOR FOR FAST WAKE UP OSCILLATORS

BACKGROUND

Designing a fast start up oscillator having an active mode current consumption of a few microamperes and controlled inrush currents presents a number of issues. Often a fast start up leads to large inrush currents that gradually diminish when the control loop kicks in. During the time for the control loop to close, the desired inrush current may exceed the desired design budget. Further, if the oscillator needs to be accurate as well, then a more elaborate bias generator that delivers a more accurate reference voltage and current may be necessary. This accuracy usually comes at the expense of increased current consumption and increased time to start and increased time to accurately settle the control loop. Additionally, if the oscillator needs to operate at higher frequency (e.g., 10 MHz) the current consumption goes up as well.

SUMMARY

Provided are embodiments that enable fast start up, ultra-low power bias generators for fast wake up oscillators and other applications.

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a exemplary embodiment adequate to allow those of ordinary skill in the art to make and use the inventive concepts will follow in the later sections.

Various embodiments may also relate to a bias generator including: a bias generator circuit; a master startup circuit that applies current to a first node in the bias generator circuit; a second startup circuit that applies current to additional nodes in the bias generator circuit; and a power switch that receives a power from a power supply and that provides power to the bias generator circuit, the master startup circuit, and the second startup circuit.

Various embodiments may also relate to a method of producing a bias signal, including: supplying power to a bias generator circuit; applying a first startup current to a node in the bias generator circuit; applying a second startup current to additional nodes in the bias generator circuit; and outputting a bias signal.

Various embodiments may also relate to a method of controlling a bias generator, including: receiving an external timing control signal; applying the external timing control signal to a master startup circuit; producing a first timing control signal by delaying the external timing control signal; applying the first timing control signal to the master startup circuit and a second startup circuit; producing a second timing control signal by delaying the external timing control signal; and applying the second timing control signal to a power switch to supply power to the bias generator.

BRIEF DESCRIPTION OF THE DRAWINGS

In order to better understand various exemplary embodiments, reference is made to the accompanying drawings wherein.

DETAILED DESCRIPTION

Figure 1:
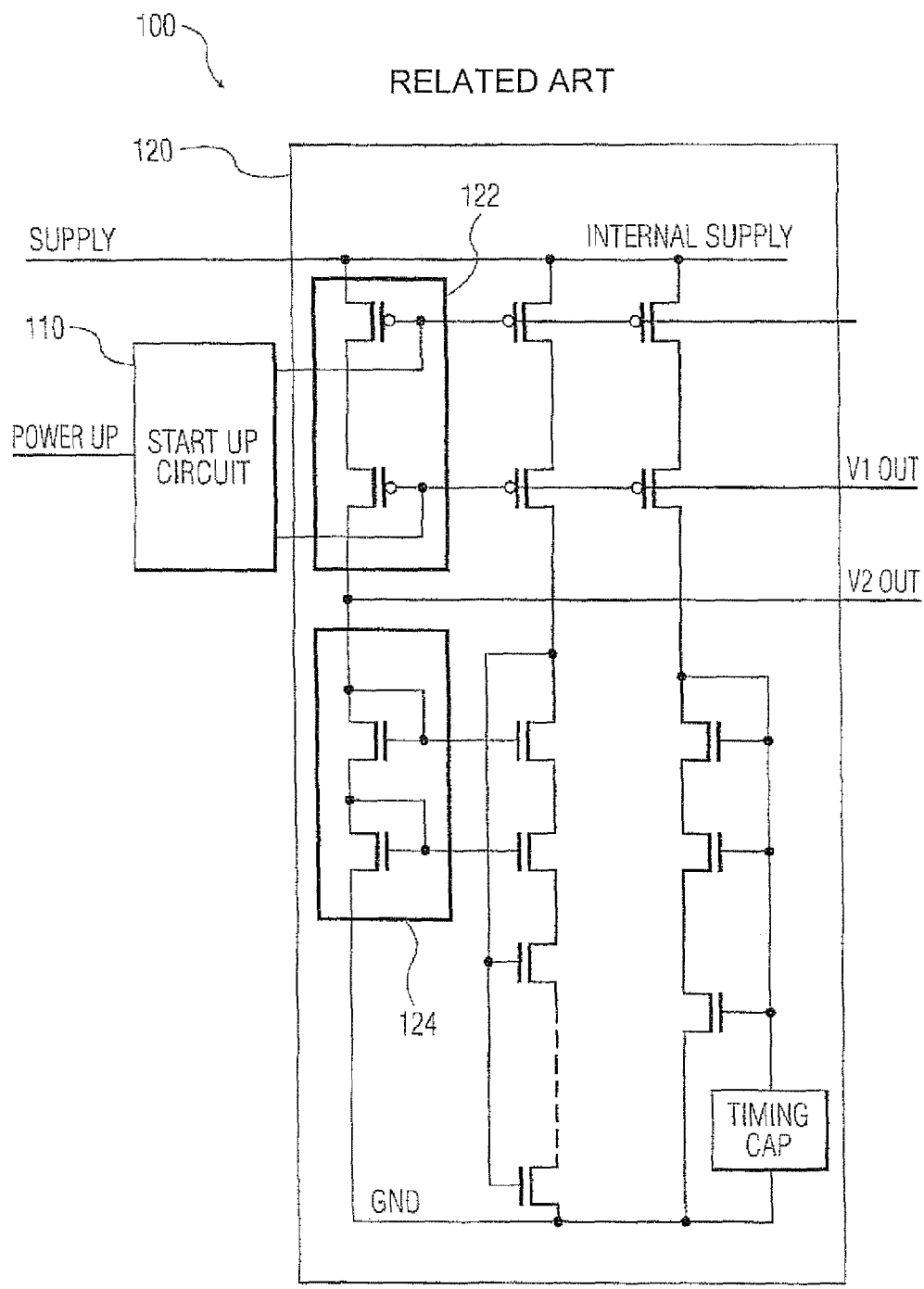
FIG. 1 is a circuit diagram illustrating a main bias generator with startup circuitry according to the related art.

Referring now to the drawings, in which like numerals refer to like components or steps, there are disclosed broad aspects of various exemplary embodiments.

In designing bias generators, there may be a number of important design parameters such as noise, power supply rejection ratio, power consumption, output drift due to temperature, operating voltage range, accuracy of the absolute output value and reliable start up. Many techniques have been developed to achieve these qualities, but almost all of them end up increasing the start up and settling time. Because applying some of these techniques may be necessary to achieve a high performance, the slow start up time must be solved in some other way. A main bias generator may be one of the significant contributors to slow start up. Therefore, improving the main bias generator may lead to ultra low power and fast wake up.

Traditionally, related art bias generators include one start up circuit. FIG. 1 is a circuit diagram illustrating a main bias generator 100 including a startup circuit 110 and a bias generator circuit 120 according to the related art. The bias generator circuit 120 may include cascoded PMOS transistors 122 and cascoded NMOS transistors 124. The bias generator circuit 120 may include outputs V1 out and V2 out that are the biasing signals to drive the oscillator. The startup circuit 110 may control the start up behavior of the PMOS transistors 122. Alternatively, the startup circuit 110 may control the startup behavior of the NMOS transistors 124. A proper start up of the bias generator circuit 120 may provide for reliable operation. If the main bias generator 100 is designed for ultra low power (for example, nanoampere biasing), there may not be enough current to charge and discharge the internal nodes of the bias generator circuit 120 fast enough to produce an output in a few microseconds.

Figure 2:
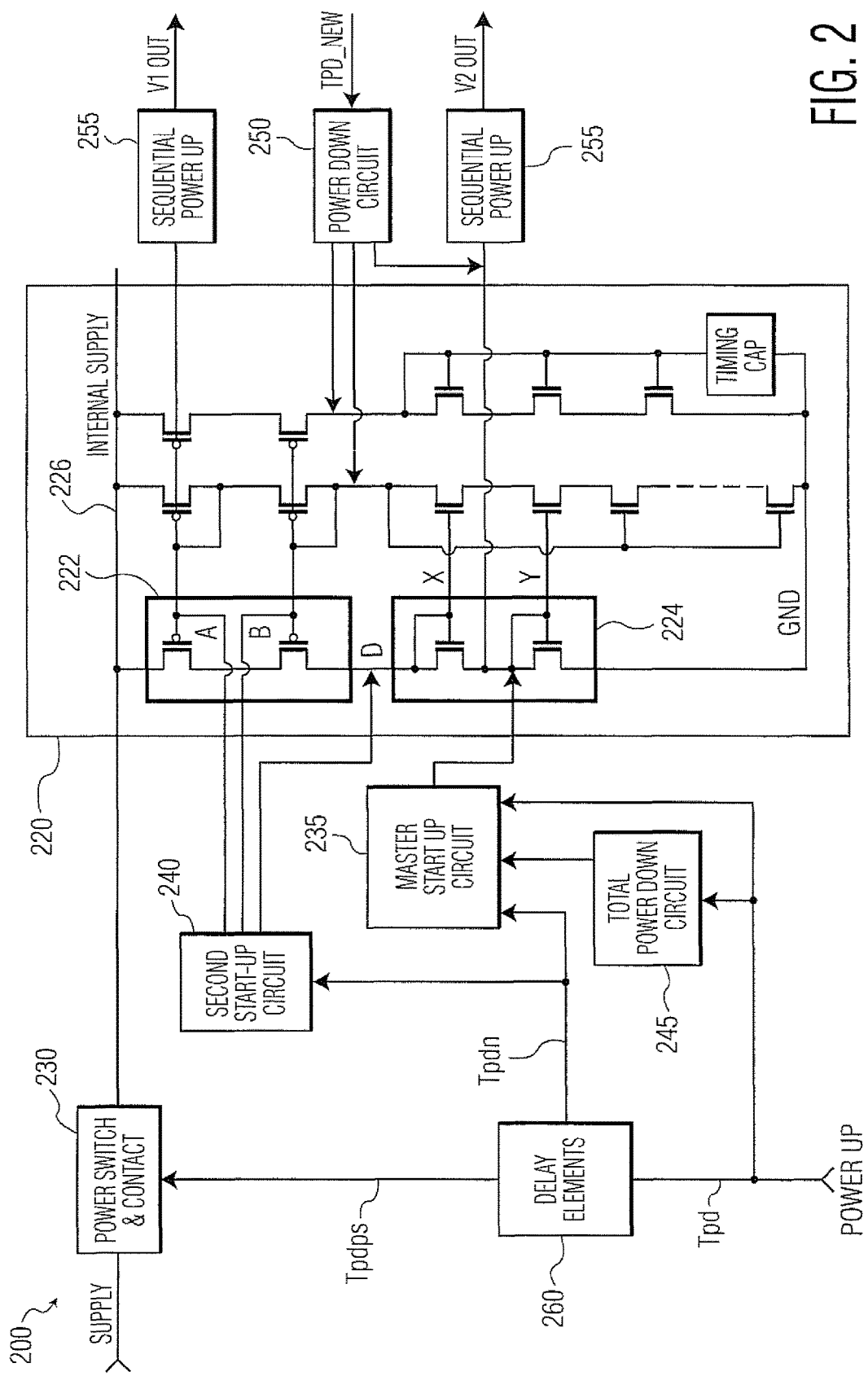
FIG. 2 is a circuit diagram illustrating an embodiment of distributed start up circuitry implemented with multiple startup blocks.

FIG. 2 is a circuit diagram illustrating an embodiment of distributed start up circuits implemented with multiple startup circuits. To improve the startup performance of the main bias generator the startup circuit is distributed in to multiple startup circuits that control PMOS transistors, NMOS transistors and all the high impedance nodes individually and in a controlled sequential way.

A main bias generator 200 may include a bias generator circuit 220, a power switch 230, a master startup circuit 235, a second startup circuit 240, a total power down circuit 245, power down circuit 250, sequential power up circuits 255, and delay elements 260. The bias generator circuit 220 is the same as that found in FIG. 1 and may include cascoded PMOS transistors 222 and cascoded NMOS transistors 224.

The power switch 230 may connect to a power supply and may receive a timing control signal TPDPS from the delay elements 260. The power switch 230 connects and disconnects power to the main bias generator 200 based upon the timing control signal TPDPS. The power switch 230 may control leakage currents in a total power down mode.

The master startup circuit 235 may provide startup current to a node Y. Node Y, as illustrated in FIG. 2, may be at the gate of a lower NMOS cascoded transistor 224. Providing a startup current to node Y may allow the transistor below node Y to be energized directly, rather than relying upon current propagating through the PMOS cascoded transistors 222 and the upper NMOS cascoded transistor 224, which takes time, thus inhibiting the ability to quickly produce startup power from the main bias generator 200. Further, the transistor below node Y is one the key elements of the bias generator circuit 220. The master startup circuit 235 may receive timing control signals TPD and TPDN and may be connected to the total power down circuitry 245. The timing control signals TPD and TPDN may provide timing control for the master startup circuit 235 in order to control the startup timing of the main bias generator 200. The total power down circuit 245 may allow for the master startup circuit 235 to be completely shut down resulting in a total shutdown of the main bias generator 200.

The second startup circuit 240 may provide startup current to nodes A, B, and X. The second startup circuit 240 may receive the control signal TPDN that may provide timing control for the second startup circuit 240 in order to control the startup timing of the main bias generator 200.

The total power down circuit 245 and power down circuit 250 may work together to power down the bias generator circuit 220. The total power down circuit 245 may work in conjunction with the power switch 230 to completely cut off all power to the main bias generator 200. Further, the total power down circuit 245 may ground the output of the master startup circuit 235. The only power in the main bias generator 200 would be due to current leakage through the power switch 230. Further, the power down circuit 250 may ground certain nodes in the bias generator circuit 220. There are situations where total power down is not desired, for example, when a quick start up is needed. In this situation, the power switch 230 would be opened allowing power to be applied to the internal supply line 226. This may energize portions of the bias generator circuit 220 to allow for a quicker startup, because the internal power supply line 226 would not need to build up to its desired voltage level to then energize portions of the bias generator circuit 220. This does come at the expense of additional leakage current throughout the bias generator circuit 220 as well as additional power consumption. While the total power down circuit 245 and the power down circuit 250 are shown as separate circuits, they may both be integrated into a larger circuit that may include several of the other circuit elements of the main bias generator 200.

The sequential power up circuits 255 may be used to control the voltage outputs of the bias generator circuit 220. The sequential power up circuits 255 may include switches that turn on to provide the output from the bias generator circuit 220 to the oscillator when the output has reached the desired state. Because it takes time for energy to move through the bias generator circuit 220, it may take time for the output of the bias generator circuit 220 to reach the desired state. Further, the sequential power up circuits 255 may be used to turn off the output of the bias generator circuit 220, when the main bias generator 200 is turned off.

The delay elements 260 may receive a timing control signal TPD that may then be delayed by various amounts to produce various additional timing control signals to control the bias generator circuit 220. The timing control signals output from the delay elements 260 may include TPDPS, TPDN, and TPD_NEW. Each of these signals will be described further below when the operation of the main bias generator 200 is described.

The various elements of the main bias generator 200 may be implemented as a single integrated circuit or as a combination of integrated circuits and other circuit elements. The precise level of integration may be driven by the ability to combine existing integrated circuits to implement the main bias generator 200. For example, almost any well known start up circuitry may be used as the master startup circuit 235 with some small modifications. Because start up circuitry is one of the key and sensitive blocks on each integrated circuit, there may be a tendency to not alter that circuit after it has been tested and proven in the field. Accordingly, the present embodiment may use any well known start tip circuitry as the master startup circuit 235.

As described above in the embodiment of FIG. 2, distributing the startup circuits provides fine control on each and every node in the bias generator circuit 220. But to improve the startup of the bias generator circuit 220, careful timing control is needed. This timing control is described below.

Figure 3:
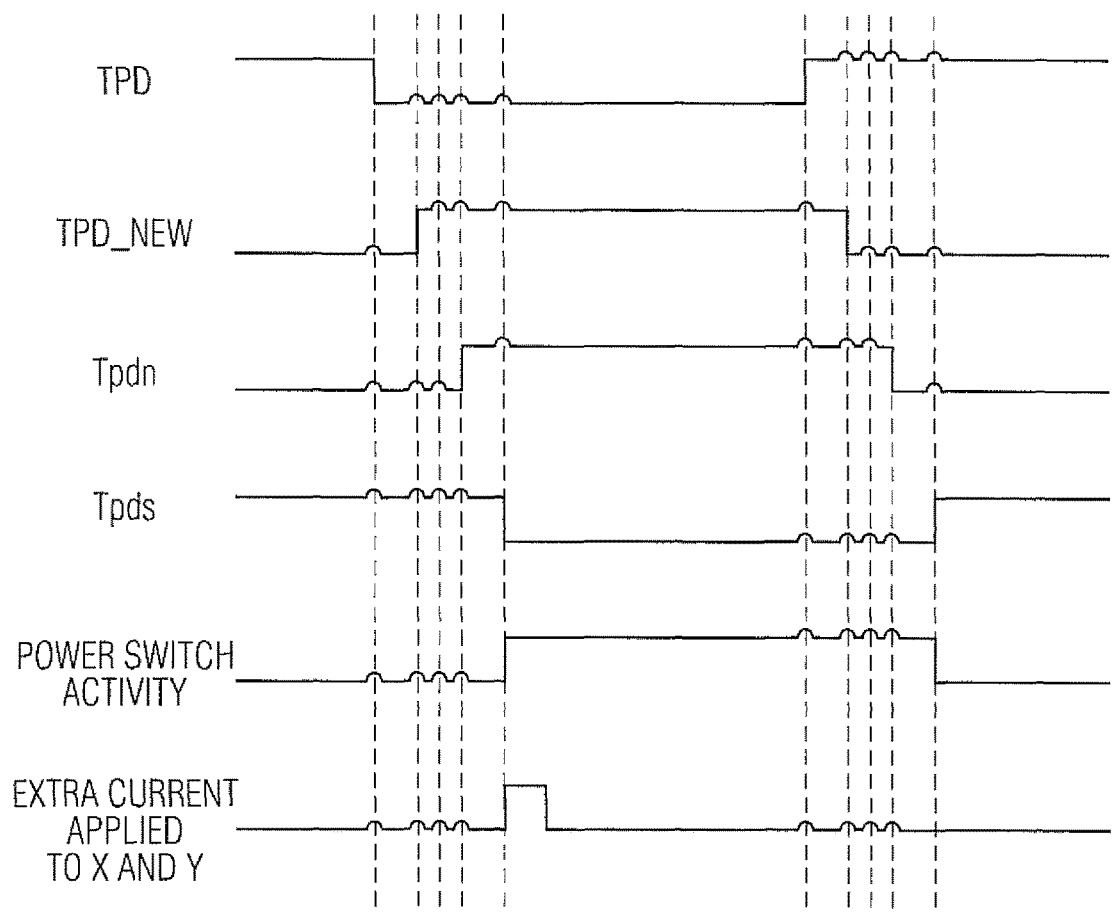
FIG. 3 is a timing diagram illustrating how the circuit of FIG. 2 operates.

FIG. 3 is a timing diagram illustrating how the circuit of FIG. 2 operates. The state of the timing control signals TPD, TPD_NEW, TPDN, and TPDPS are shown as a function of time. Further, the state of the power switch 230 and extra current applied at nodes X and Y are shown. First, TPD, which is an external timing control signal, changes state to a low state. TPD may be applied to the master startup circuit 235, the total power down circuit 245, and the delay elements 260. When the master bias generator 200 is shut down, the output of the master startup circuit 235 may be connected to ground. So when TPD changes states, TPD may disconnect the output of the master startup circuit 235 from ground using circuitry within the master startup circuit 235 and also using the total power down circuit 245. Further, TPD may be used by the delay elements 260 to produce the other timing control signals TPD_NEW, TPDN, and TPDPS.

Next, TPD_NEW, which is produced by delaying and inverting TPD, changes state to a high state. TPD_NEW may be applied to the power down circuit 250. As described above, the power down circuit 250 may ground portions of the bias generator circuit 220. When TPD_NEW is applied at this time, the power down circuit 250 disconnects the portions of the bias generator circuit from ground. This prepares those portions for the application of power.

Next, TPDN, which is produced by delaying TPD_NEW, changes state to a high state. TPDN may be applied to the master startup circuit 235 and the second startup circuit 240. TPDN turns on the master startup circuit 235 and the second startup circuit 240.

Finally, TPDPS, which is produced by delaying and inverting TPD_NEW, changes state to a low state. TPDPS may be applied to the power switch 230. This turns the power switch 230 on as shown by "Power switch activity" in FIG. 3, allowing power to into the main bias generator 200.

While specific high or low states of the various signals were described above, inverted states may also be used. The specific states used are driven by the circuits used and may be chosen accordingly. So the invention is not limited to the specific states described above. Further, while the various control signals are described as being generated by delaying previous signals, any of the delayed signals may also be generated by any other signal that has a previous state transition.

The master startup circuit 235 is connected to node Y to momentarily boost up the current in order to quickly generate output bias current. The second startup circuit 240 is connected to nodes A, B, and X to momentarily boost up the current at those nodes. The momentary boost in current at nodes X and Y are shown in FIG. 3. This current boost from the master startup circuit 235 and the second startup circuit may allow the main bias generator 200 to quickly startup and reach a steady state operation thus decreasing the startup time of the oscillator.

Further, the sequential power up circuits may be turned on during the startup process to output V1_out and V2_out. This allows the main bias generator 200 to control when V1_out and V2_out are output so that the outputs have reached the desired states.

When it is desired to turn the main bias generator 200 off, the power switch 230, the total power down circuit 245, and the power down circuit may be used in various combinations. For example, a total power down may be accomplished by the power switch opening to turn off the power supply, by the total power down circuit 245 grounding the output of the master startup circuit, and by the power down circuit 250 grounding selected nodes in the bias generator circuit. This will lead to the lowest power consumption when the main bias generator 200 and its associated oscillator are not in use, but it does increase the startup time. For example, if the power switch is left closed to allow the supply to provide the internal supply 226, then the main bias generator 200 and its associated oscillator will startup more quickly, but power consumption will increase. Other intermediate power states may be achieved by using the total power down circuit 245 and/or the power down circuit 250.

While the main bias generator 200 has been described as powering up an oscillator, the main bias generator 200 may be used with other circuits requiring fast low power startup, such as for example, a fast startup regulator. Further, additional startup circuits may be used to apply current to nodes in the bias generator circuit 220 as needed.

The use of two startup circuits to supply additional current in a bias generator circuit has been described. Further, various additional control circuitry and timing have been described. With the extra current supplied by the two startup circuits, the bias currents come up extremely fast. Additionally, the power consumption may be controlled by the various additional control circuits.

It should be appreciated by those skilled in the art that any block diagrams herein represent conceptual views of illustrative circuitry embodying the principles of the invention. Similarly, it will be appreciated that any state transition diagrams, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A bias generator comprising:
   a bias generator circuit;
   a master startup circuit that is configured to apply a first startup current to a first node in the bias generator circuit;
   a second startup circuit that is configured to apply a second startup current to additional nodes in the bias generator circuit; and
   a power switch that is configured to receive power from a power supply and provide power to the bias generator circuit, wherein the master startup circuit is configured to receive a first timing control signal, the second startup circuit is configured to receive a second timing control signal, the second timing control signal is a delayed version of the first timing control signal, the power switch, the master startup circuit, and the second startup circuit are turned on in a desired order, and both the first timing control and the second timing control signal are applied to the master startup circuit.

2. The bias generator of claim 1, further comprising:
   delay elements that are configured to receive an external timing control signal to produce the first and second timing control signals.

3. The bias generator of claim 1, further comprising:
   a power down circuit that is configured to power the bias generator down.

4. The bias generator of claim 1, wherein the bias generator circuit further comprises:
   a cascoded PMOS transistor pair; and
   a cascoded NMOS transistor pair.

5. The bias generator of claim 4, wherein the cascoded PMOS transistor pair is connected between a power supply line and the cascoded NMOS transistor pair, the cascoded NMOS transistor pair is connected between a ground and the cascoded PMOS transistor pair, and the master startup circuit is connected to a node in the cascoded NMOS transistor pair.

6. The bias generator of claim 1, wherein the bias generator circuit is configured to bias an oscillator.

7. A method of producing a bias signal, comprising:
   supplying power through a power switch from a power supply to a bias generator circuit;
   applying, with a master startup circuit, a first startup current to a first node in the bias generator circuit;
   applying, with a second startup circuit, a second startup current to additional nodes in the bias generator circuit; and
   outputting the bias signal, wherein a first timing control signal controls the application of the first startup current, a second timing control signal controls the application of the second startup current, the second timing control signal is a delayed version of the first timing control signal, the power switch, the master startup circuit, and the second startup circuit are turned on in a desired order, and both the first timing control and the second timing control signal are applied to the master startup circuit.

8. A method of controlling a bias generator, comprising:
   receiving an external timing control signal;
   applying the external timing control signal to a master startup circuit;
   producing a first timing control signal by delaying the external timing control signal;
   applying the first timing control signal to the master startup circuit and a second startup circuit;
   producing a second timing control signal by delaying the external timing control signal; and
   applying the second timing control signal to a power switch to supply power to the bias generator.

9. The method of claim 8, wherein producing the second timing control signal includes delaying the first timing control signal.

10. The method of claim 8, further comprising:
    applying a current signal from the master startup circuit to a node in the bias generator circuit.

11. The method of claim 10, further comprising:
    applying a current signal from the second startup circuit to additional nodes in the bias generator circuit.

12. The method of claim 11, wherein the node is in a cascoded NMOS transistor pair in the bias generator circuit.

13. The method of claim 12, wherein the additional nodes includes a first additional node, a second additional node, and a third additional node, the first additional node is at a gate of an upper transistor of the cascoded NMOS transistor pair, the second additional node is at a gate of an upper transistor of a cascoded PMOS transistor pair, and the third additional node is at a gate of a lower transistor of the cascoded PMOS transistor pair.

14. The method of claim 8, further comprising:
producing a third timing control signal by delaying the external timing control signal; and
applying the third timing control signal to a power down circuit.

15. The method of claim 14, further comprising:
applying the external timing control signal to a total power down circuit.

16. The method of claim 15, wherein the total power down circuit connects and disconnects an output of the master startup circuit to a ground.

17. The bias generator of claim 1, wherein the second timing control signal is applied to both the master startup circuit and the second startup circuit, and a third timing control signal is applied to the power switch.

18. The bias generator of claim 3, wherein the power switch is configured to control leakage currents in a total power down mode.

* * * * *